US009922702B1

(12) United States Patent
Shanmugam et al.

(10) Patent No.: US 9,922,702 B1
(45) Date of Patent: Mar. 20, 2018

(54) APPARATUS FOR IMPROVING READ STABILITY

(71) Applicant: Intel Corporation, Santa Clara, CA (US)

(72) Inventors: Amarnath Shanmugam, Austin, TX (US); Anik Basu, Austin, TX (US); Steve P. Ferrera, Austin, TX (US); Srinivas Rajamani, Austin, TX (US); Feroze A. Merchant, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/397,035

(22) Filed: Jan. 3, 2017

(51) Int. Cl.
*G11C 11/00* (2006.01)
*G11C 11/419* (2006.01)
*G11C 11/412* (2006.01)
*H03K 19/20* (2006.01)

(52) U.S. Cl.
CPC .......... *G11C 11/419* (2013.01); *G11C 11/412* (2013.01); *H03K 19/20* (2013.01)

(58) Field of Classification Search
CPC ... G11C 11/419; G11C 11/412; G11C 11/413; H03K 19/20
See application file for complete search history.

(56) References Cited

U.S. PATENT DOCUMENTS

| 7,277,315 | B2* | 10/2007 | Yuan | G11O 5/145 365/149 |
| 7,283,406 | B2* | 10/2007 | Lu | G11C 16/10 365/189.09 |
| 8,570,791 | B2* | 10/2013 | Liu | G11C 11/413 365/154 |
| 2007/0002673 | A1* | 1/2007 | Miller | G11C 11/413 365/230.06 |
| 2009/0021990 | A1* | 1/2009 | Liston | G11O 5/144 365/189.11 |
| 2011/0267880 | A1* | 11/2011 | Swei | G11O 5/148 365/175 |
| 2014/0119101 | A1* | 5/2014 | Wang | G11C 8/08 365/154 |
| 2015/0003174 | A1* | 1/2015 | Joshi | G11C 11/419 365/189.11 |
| 2016/0233866 | A1* | 8/2016 | Ishizu | H03K 19/017509 |

* cited by examiner

*Primary Examiner* — Toan Le
(74) *Attorney, Agent, or Firm* — Green, Howard, & Mughal LLP

(57) ABSTRACT

Described is an apparatus which comprises: a pass-gate; a sleep transistor configured as a diode-connected device controllable by the pass-gate; and a word-line driver coupled to the sleep transistor and the pass-gate.

20 Claims, 8 Drawing Sheets

APPARATUS FOR IMPROVING READ STABILITY

BACKGROUND

As transistor dimensions continue to shrink with each new process technology, read stability of a six transistor (6T) Static Random Access Memory (SRAM) bit-cell becomes a challenging issue for SRAM design. Various read assist techniques are used to maintain the read stability of the SRAM bit-cell. One method is to reduce the voltage at a word-line driver during a normal read or write operation which weakens the transfer gate of the 6T bit-cell and aids bit-cell read stability. However, traditional methods for under driving the word-line results in high dynamic power dissipation, electro-migration, and reliability issues with read assist circuits, etc.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
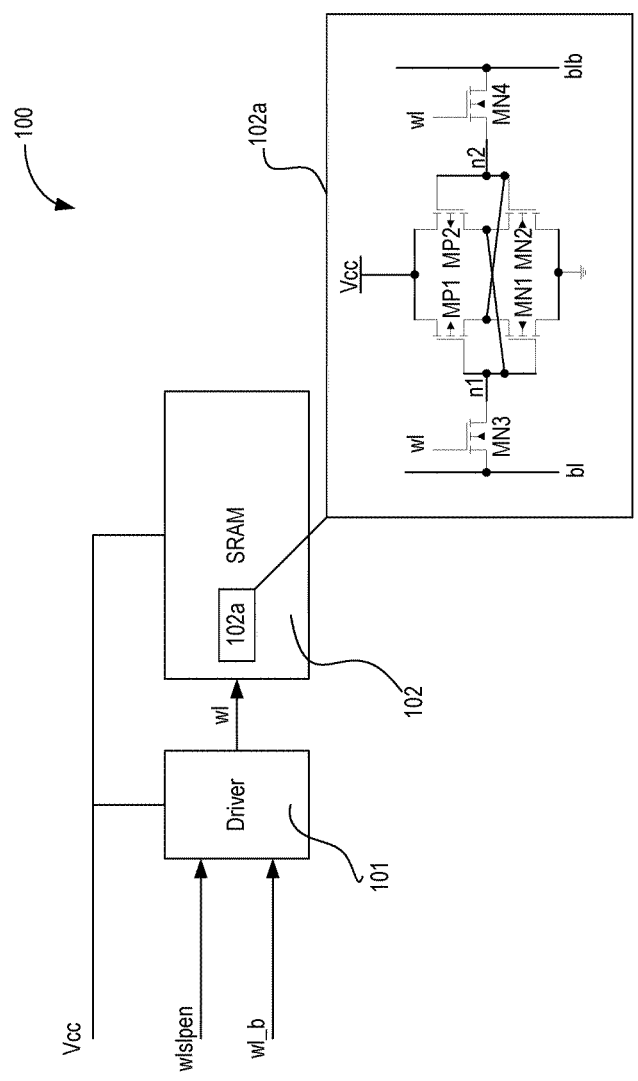
FIG. 1 illustrates a portion of a memory system having a word-line driver with improved read stability, according to some embodiments of the disclosure.

Some embodiments describe an apparatus and method for improving read stability. The apparatus of some embodiments is a word-line circuit which is operable to generate sufficient word-line underdrive to assist with fast read or write operation(s) in a memory cell while consuming less dynamic power and area than traditional word-line drivers. In some embodiments, the word-line circuit includes a word-line driver, a sleep transistor, a tristate-able driver, a diode-connected device, and logic to control the tristate-able driver and the diode-connected device.

In some embodiments, an active virtual supply is generated for the word-line driver of the word-line circuit using the diode-connected device. In embodiments where the memory cell has n-type access devices controlled by the word-line, the active virtual supply is generated to be less than the input power supply voltage. In one such embodiment, the diode-connected device is a p-type gate-to-drain connected transistor. In embodiments where the memory cell has p-type access device controlled by the word-line, the active virtual supply is generated to be higher than the ground supply voltage. In one such embodiment, the diode-connected device is an n-type gate-to-drain connected transistor.

Referring back to the p-type diode connected device, in some embodiments, the p-type diode connected device creates a virtual supply which does not fall below the value of its threshold voltage. In addition, the existing gate capacitance of the word-line sleep transistor is used for generating the word-line underdrive by a charge sharing scheme. This scheme removes the need for any external dummy capacitance and saves area, in accordance with some embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nano tubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure.

FIG. 1 illustrates a portion of a memory system 100 having a word-line driver with improved read stability, according to some embodiments of the disclosure. In some embodiments, system 100 comprises driver circuit 101 and memory array 102. In some embodiments, driver circuit 101 receives "wlslpen" (word-line sleep enable) signal and "wlb" (or "wl_b") signal to generate "wl" (word-line) signal for writing or reading from the one or more memory bit-cells. Here, "wlslpen" signal is used to turn on or off a sleep transistor coupled to the supply node "Vcc" and a virtual supply node "wlvcc" for the word-line driver. In some embodiments, the sleep transistor is turned on by "wlslpen" signal when read or write access is needed. The voltage level of the "wl" signal is generally sufficiently lower than the voltage level of "Vcc" to provide read assist to the memory bit-cell. Here, signal names and node names are interchangeably used. For example, "wl" may refer to word-line node or word-line signal on that node, depending on the context of the sentence. Various embodiments here are described with reference to a six transistor (6T) static random access memory (SRAM). However, the embodiments are not limited to a 6T SRAM. For example, the embodiments are applicable to 4T SRAM, 8T SRAM, dual-port SRAM, and other types of memories that use a word-line driver.

One example of a traditional SRAM bit-cell 102a is shown in FIG. 1 which includes, bit-line (BL), word-line (WL), complementary bit-line (BLB), p-type transistors MP1 and MP2, and n-type transistors MN1, MN2, MN3, and MN4. Transistors MN3 and MN4 are access devices controlled by word-line "wl" which is driven by driver circuit 101. Nodes, "n1" and "n2" are the storage nodes of the memory bit-cell. To read or write from or to memory bit-cell 102a, "wl" is activated to turn on the access devices MN3 and MN4. Bit-lines BL and BLB are then used to either provide data for writing to the storage nodes "n1" and "n2", or are used for reading data stored on storage nodes "n1" and "n2" by sensing then via sense amplifiers (not shown). There is an inherent contention caused by the p-type devices MP1 and MP2 and the access devices when reading or writing to the storage nodes.

Various embodiments describe a driver 101 that improves read and/or write stability by generating a large word-line underdrive on the "wl" node with less dynamic power and area than traditional word-line drivers. This is achieved by generating an active virtual supply for word-line drivers (which is less than the supply voltage) using a gate-drain connected PMOS transistor (or a diode-connected device). A gate-drain connected PMOS transistor creates a virtual supply which will not fall below the value of its transistor threshold voltage Vt. In addition, the existing gate capacitance of the word-line sleep transistor is used for generating the word-line underdrive by a charge sharing scheme. This removes the need for an external dummy capacitance and saves area.

Figure 2:
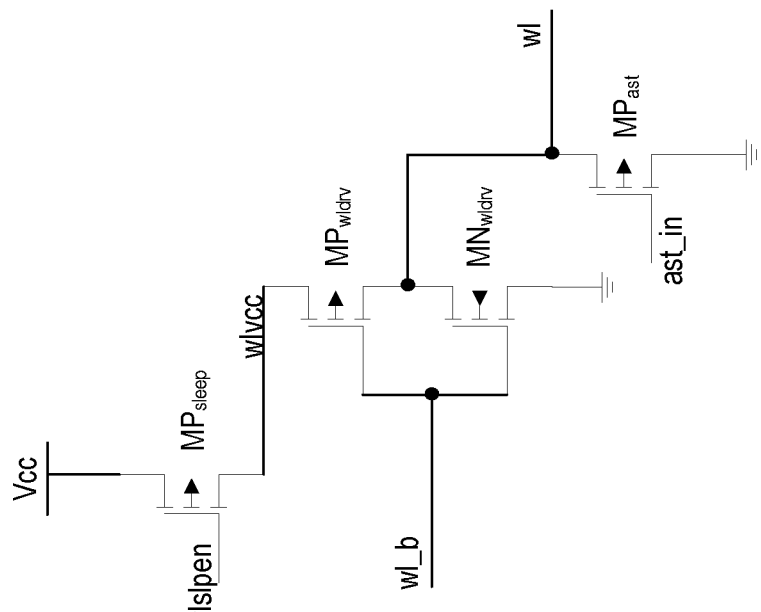
FIG. 2 illustrates a traditional word-line driver.
Figure 3:
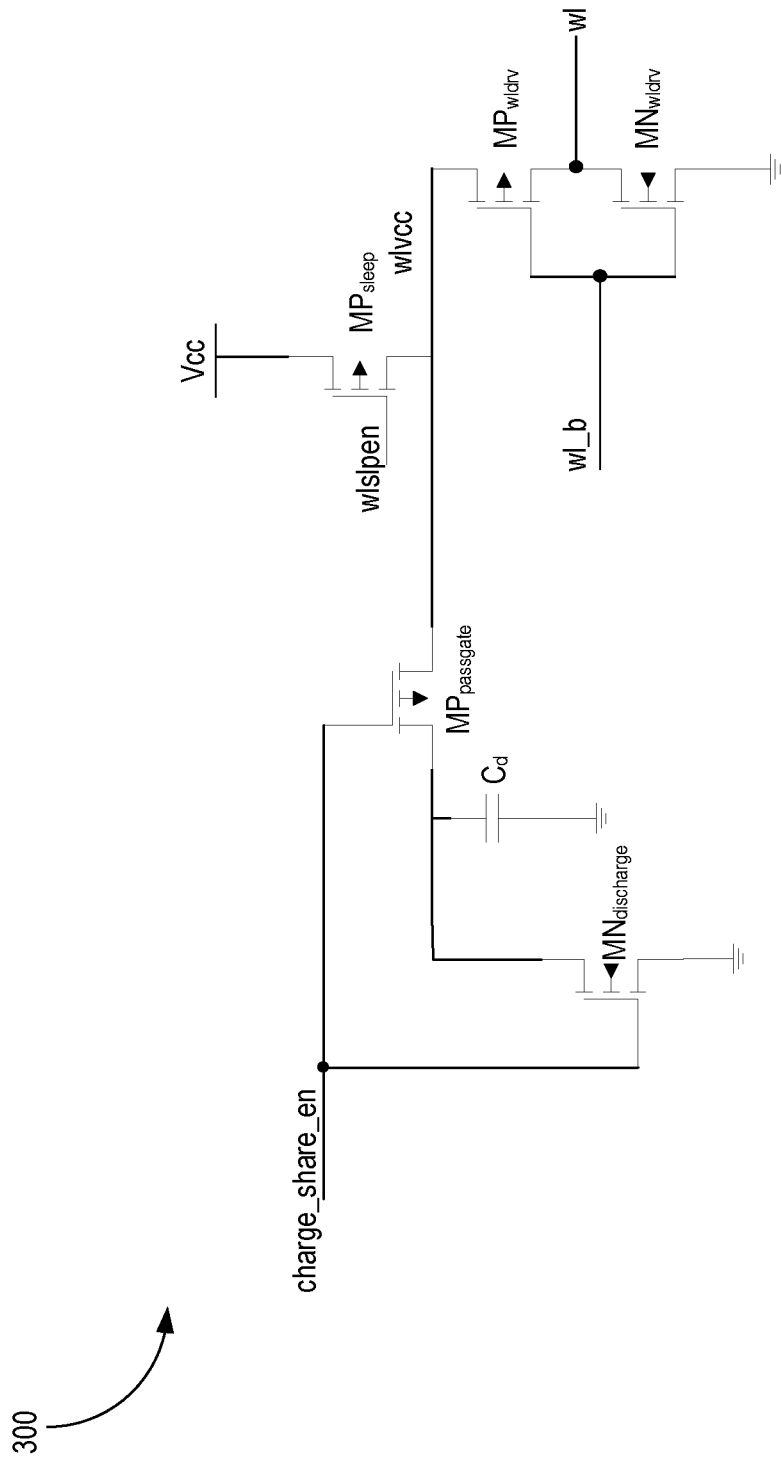
FIG. 3 illustrates a charge-sharing based word-line driver.

Traditionally, word-line underdrive is achieved using one of these two methods—voltage divider circuits (e.g., FIG. 2) or a charge sharing circuit using a dummy capacitance (e.g., FIG. 3).

FIG. 2 illustrates a traditional word-line driver 200. It is pointed out that those elements of FIG. 2 having the same reference numbers (or names) as the elements of any other figure can operate or function in any manner similar to that described, but are not limited to such. Here, word-line driver 200 consists of sleep transistor $MP_{sleep}$, assist transistor $MP_{ast}$, and driver transistors $MP_{wldrv}$ and $MN_{wldrv}$. In this example, the sleep transistor $MP_{sleep}$ is a p-type transistor which is coupled to the supply node "Vcc" and the virtual supply node "wlvcc". Sleep transistor $MP_{sleep}$ is controlled by "wlslpen" and is turned on when read or write access is needed. When Sleep transistor $MP_{sleep}$ is turned on, "wlvcc" is coupled to voltage supply. The main driver component of traditional word-line driver 200 consists of transistors $MP_{wldrv}$ and $MN_{wldrv}$ which are coupled together in series in an inverter structure such that when "wlvcc" is present (e.g., when $MP_{sleep}$ is turned on), input "wl_b" is inverted and provided as "wl" as output. Transistor $MP_{ast}$ is a p-type (but can be replaced with an n-type transistor) which is turned on during the entire duration of read or write operation. The $MP_{ast}$ transistor creates contention with the $MP_{wldrv}$ transistor which reduces the voltage level on the node "wl" such that it under drives "wl" (e.g., by 10% to 20% of Vcc).

In case of the smallest (e.g., high-density) 6T SRAM bit-cell (such as bit-cell 102a), the underdrive voltage required on "wl" to achieve the bit-cell stability is very high. The size of the contention $MP_{ast}$ transistor can be as high as 65% of the word-line driver transistor $MP_{wldrv}$ size and the contention transistor needs to be a lower threshold device in order to achieve the high underdrive voltage needed on "wl". This raises significant concerns in dynamic power dissipation, electro migration, reliability, and area of these read assist circuits for achieving the word line underdrive value.

FIG. 3 illustrates a charge-sharing based word-line driver 300. It is pointed out that those elements of FIG. 3 having the same reference numbers (or names) as the elements of any other figure can operate or function in any manner similar to that described, but are not limited to such.

FIG. 3 describes a scheme used to generate the underdrive on "wl" using a dummy capacitance. Compared to FIG. 2, here a p-type transistor $MP_{passgate}$ is coupled to "wlvcc" and n-type discharge transistor $MN_{discharge}$ while dummy or extra capacitor $C_d$ is coupled to p-type transistor $MP_{passgate}$ and n-type discharge transistor $MN_{discharge}$. Here, pull-down assist transistor $MP_{ast}$ is removed. The sleep transistor $MP_{sleep}$ creates the virtual supply "wlvcc" for the word-line driver (i.e., transistors $MP_{wldrv}$ and $MN_{wldrv}$) and the capacitance of the dummy capacitor $C_d$ can be gate capacitance, drain capacitance, or any other parasitic capacitance. During a normal read/write operation, the sleep transistor $MP_{sleep}$ is turned off and the transistor $MP_{passgate}$ is turned on before the word-line driver is triggered high. This action will float the virtual supply node "wlvcc" and enables charge sharing with the dummy capacitor $C_d$ by turning on transistor $MP_{passgate}$ via the "charge_share_en" signal. The charge sharing lowers the virtual supply voltage on "wlvcc" based on the ratio of capacitances between the dummy capacitor $C_d$ and "wlvcc". The capacitance on the node "wlvcc" is very high as it is connected to multiple word-line drivers (e.g., 256 drivers). To lower the voltage on the high capacitance node "wlvcc", the dummy capacitor $C_d$ has to be of sufficient large value which becomes significant increase in area. Also, this scheme uses a floating supply node for the word-line driver, and this node will get depleted of charge at high leakage corners or slow frequency operation which in turn slows the read operation or in some cases fails the read operation.

Figure 4:
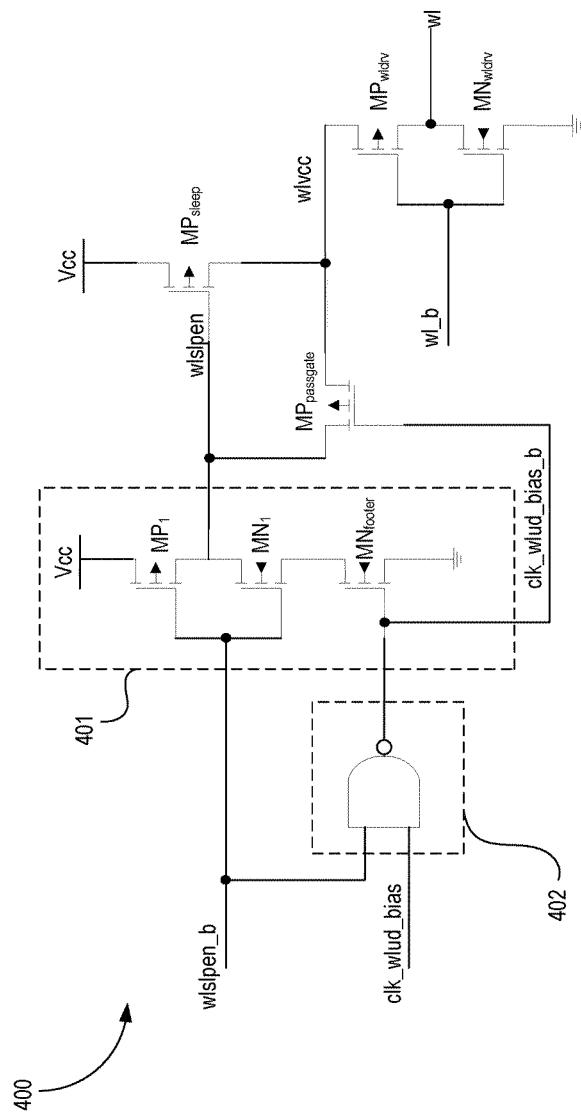
FIG. 4 illustrates a word-line driver with improved read stability, according to some embodiments of the disclosure.

FIG. 4 illustrates word-line driver 400 with improved read stability, according to some embodiments of the disclosure. It is pointed out that those elements of FIG. 4 having the same reference numbers (or names) as the elements of any other figure can operate or function in any manner similar to that described, but are not limited to such.

In some embodiments, word-line driver 400 comprises p-type transistor $MP_{passgate}$, tristate-able driver 401, and logic gate 402. In some embodiments, $MP_{passgate}$ is operable to make $MP_{sleep}$ a diode-connected device in response to a logic state of an output logic gate 402. In some embodiments, tristate-able driver 401 comprises p-type transistor $MP_1$ coupled to "Vcc" and controllable by the "wlslpen_b" signal. In some embodiments, tristate-able driver 401 comprises n-type transistor $MN_1$ coupled in series with the transistor $MP_1$ and controllable by "wlslpen_b". In some embodiments, the drain terminals of transistors $MP_1$ and $MN_1$ are coupled to node "wlslpen" which is coupled to the gate terminal of transistor $MP_{sleep}$. In some embodiments, tristate-able driver 401 comprises an n-type footer transistor $MN_{footer}$ coupled in series with transistor $MN_1$ and controllably by a "clk_wlud_bias_b" signal. In some embodiments, the "clk_wlud_bias_b" signal is also used to control transistor $MP_{passgate}$. In some embodiments, the "clk_wlud_bias_b" signal is generated by logic 402 according to the logical conditions of "wlslpen_b" and the clock signal "clk_wlud_bias". In some embodiments, logic 402 is implemented as a NAND gate. In other embodiments, other types of logic gates can be used to implement logic 402. For example, NOR gate, OR gate, AND gate, etc. can be used in conjunction with other logics or alone to implement the function of logic 402.

In some embodiments, word-line underdrive is achieved with less dynamic power and area compared to traditional word-line drivers by generating an active virtual supply "wlvcc" for word-line drivers (which is less than the supply voltage "Vcc") using a gate-drain connected transistor $MP_{sleep}$. In addition, the existing gate capacitance of the transistor $MP_{sleep}$ is used for generating the word-line underdrive by charge sharing to save area.

In some embodiments, the virtual supply node "wlvcc" is shared between multiple word-line drivers (e.g., 256) and the transistor $MP_{sleep}$ is distributed among them. In some embodiments, tristate-able driver 401 is a common driver for the distributed transistor $MP_{sleep}$. In some embodiments, tristate-able driver 401 and logic 402 are placed outside a word-line decoder (e.g., in a timer block). In some embodiments, the virtual supply node "wlvcc" has capacitances including the source capacitances of word-line driver transistors $MP_{wldrv}$, drain capacitance of the sleep transistors $MP_{sleep}$, and interconnect wires.

Apparatus 400 has two modes of operation—sleep mode and active mode. First, during the sleep mode, when there is no read or write operation, the input signals "wlslpen_b" and "clk_wlud_bias" are held low (e.g., ground logic level). This turns off the transistor $MP_{sleep}$ transistor and the voltage on the virtual supply node "wlvcc" leaks down to zero and saves leakage current through the word-line drivers. Second, during an active mode (e.g., during read or write operation), apparatus 400 is used to generate word-line underdrive on "wl" using two charge sharing events.

In some embodiments, in the cycle before a read/write operation, the input signal "wlslpen_b" is switched to high (e.g., "Vcc" level) and the virtual supply node "wlvcc" charges back to the supply voltage "Vcc". In a normal read/write operation cycle, the input signal "clk_wlud_bias" is switched to high before the word-line driver is triggered high. This turns off the transistor $MN_{footer}$ transistor and turns on the transistor $MP_{passgate}$. Since the transistor $MN_{footer}$ transistor is turned off, the output of tristate-able driver 401 becomes high impedance (Z). Also, the nodes "wlslpen" and "wlvcc" are connected through the $MP_{passgate}$ transistor. This enables first charge sharing between the nodes "wlslpen" and "wlvcc" to reduce the virtual supply voltage "wlvcc". The voltage on the virtual supply node "wlvcc" is reduced by a value equal to a ratio between the capacitances on nodes "wlvcc" and "wlslpen" generating a first stage of word-line underdrive, in accordance with some embodiments. After the input word-line turns on (e.g., input signal "wl_b" triggered low), the capacitance on the node "wlvcc" couples with the capacitance on the word-line net "wl" through the $MP_{wldrv}$ transistor.

The second charge sharing event happens between the capacitance on the word-line node "wl" and the capacitance on "wlvcc" node which already has a reduced virtual voltage. This gives an extra underdrive at the word-line net "wl", in accordance with some embodiments. With the two events of charge sharing, word-line underdrive is generated on the node "wl" to improve the read stability of the SRAM bit-cell 102a. At the end of each read or write operation, the node "wlvcc" is charged back to the supply voltage Vcc by switching the input signal "clk_wlud_bias" to low in preparation of the next read/write access, in accordance with some embodiments. In some embodiments, if there is no access for specific number of cycles, then apparatus 400 goes back to the sleep mode.

In some embodiments, transistor $MP_{passgate}$ is replaced with an n-type pass-gate (not shown). In some embodiments, an n-type pass-gate (not shown) is coupled in parallel to transistor $MP_{passgate}$ and controllable by an inverse of "clk_wlud_bias_b". In some embodiments, the strength of $MP_{passgate}$ (or its other variations such as n-type only pass-gate, parallel combination of p-type and n-type transistors, and the like) is programmable by software (e.g., operating system or firmware) or hardware (e.g., fuse, registers, etc.). In one such embodiment, transistors are electrically connectable in parallel to the transistor of interest (e.g., transistor $MP_{passgate}$) using software or hardware means. These parallel transistors can be binary weighted or thermometer weighted in accordance with some embodiments. In some embodiments, the strength of other transistors in apparatus 400 is also variable. For example, transistors $MP_{sleep}$, $MN_{footer}$, $MP_1$, $MN_1$, $MP_{wldrv}$, and $MN_{wldrv}$ can be programmed to have greater or lesser drive strength using by software (e.g., operating system or firmware) or hardware (e.g., fuse, registers, etc.).

Figure 5:
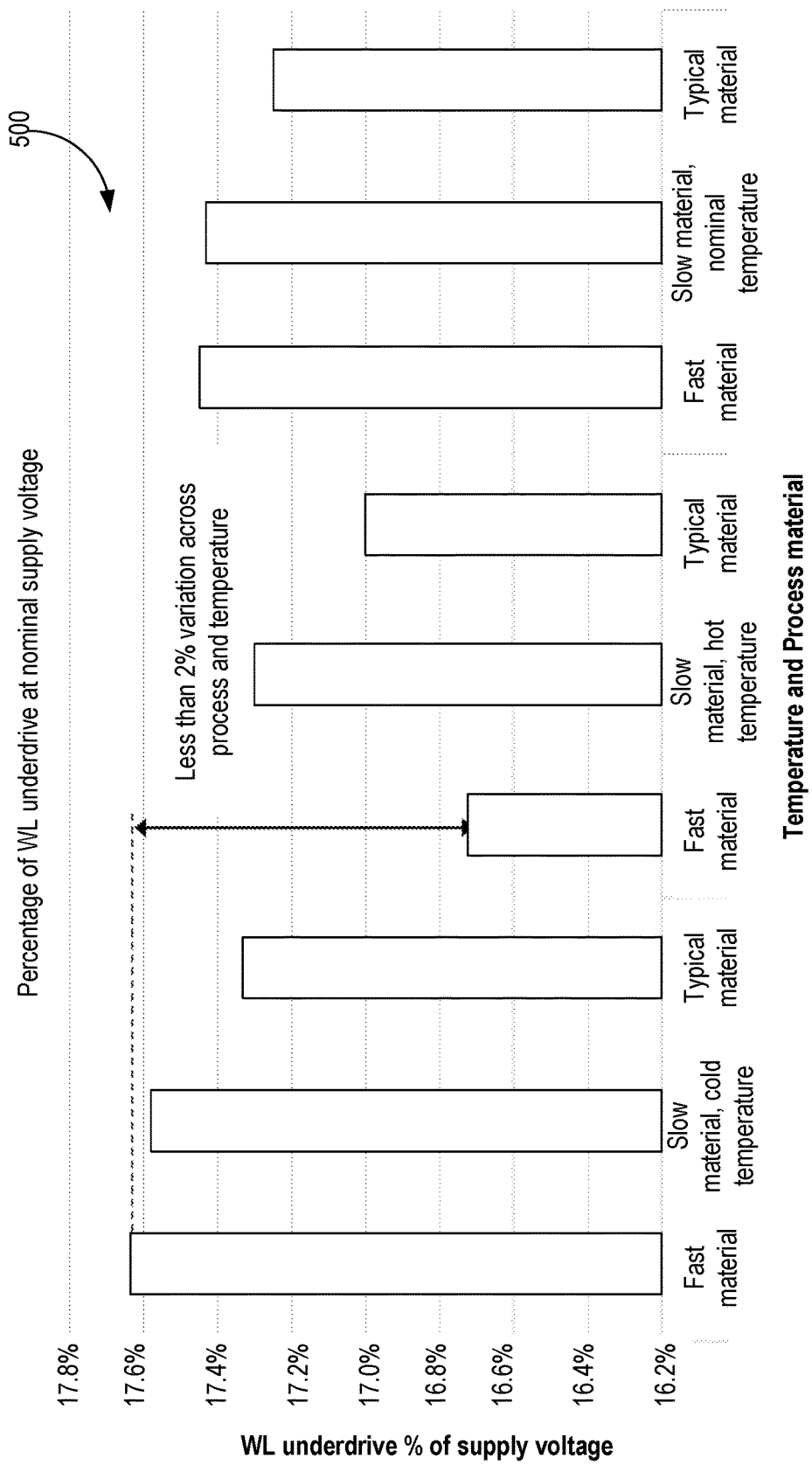
FIG. 5 illustrates a plot showing relative percentage word-line underdrive variation across voltage, temperature, and process material, according to some embodiments of the disclosure.

In some embodiments, the underdrive value at the beginning of the cycle is determined by the following factors: capacitance on the "wlvcc" node, capacitance on the "wlslpen" node, capacitance on the "wl" net, operating voltage on node "Vcc". The initial value of the underdrive shows little variation (e.g., 2%) across the process and temperature. FIG. 5 illustrates plot 500 showing relative percentage word-line underdrive variation across voltage, temperature, and process material, according to some embodiments of the disclosure.

Referring back to FIG. 4, as the underdrive value changes from the instantaneous value to the steady state value, the bit-cell read operation starts to happen and the charge on the bit-line (BL) reduces. As the read creates the differential in the bit-line nodes, the bit-cell has less danger of being disturbed. As time progresses, the increase in the word-line voltage (e.g., decrease in the underdrive value) helps the read operation without compromising stability.

The underdrive value in the beginning of the read cycle, which may be important in the bit-cell stability, can be changed by varying the capacitances involved in the charge sharing. In some cases, the capacitance of the word line net "wl" cannot be changed for a particular memory configuration. In such examples, the ratio of the capacitances between the nodes "wlslpen" and "wlvcc" can be varied to get different values of the underdrive.

Here, even though charge sharing is used, it addresses both the disadvantages of a traditional charge sharing circuit of FIG. 3. In some embodiments, the virtual supply node "wlvcc" for the word-line driver is not floating and is actively driven by the gate-drain connected transistor $MP_{sleep}$ (e.g., diode-connected transistor $MP_{sleep}$). The gate-drain connected transistor $MP_{sleep}$ ensures that the voltage on the virtual supply node "wlvcc" does not fall more than the threshold voltage "Vt" of the sleep transistor $MP_{sleep}$. In some embodiments, using the gate of the sleep transistor $MP_{sleep}$ for charge sharing removes the need for external dummy capacitance and thus saving the area. Here, the average current through the word-line driver over a cycle is about 1.5 to 5 times less than the traditional method depending on the word-line driver size, underdrive requirement, and frequency of operation. Further, average current through the word-line driver transistor $MP_{wldrv}$ is reduced (e.g., by 4 to 6 times) which helps in mitigating electro-migration problems in the word-line driver.

In some embodiments, the operation of apparatus 400 can be altered for low frequency operation to reduce power consumption further. For example, by not charging back the virtual supply node "wlvcc" to the supply voltage "Vcc" at the end of each read/write cycle, power consumption can be reduced. This is possible at low frequencies, for instance, when there is enough time to bring the node "wlvcc" to the steady state value within one clock cycle. In this example, the cycle before an active operation (e.g., read/write), "wlslpen_b" and "clk_wlud_bias" are switched to high. As such, transistor $MN_{footer}$ turns off and transistor $MP_{passgate}$ turns on. The gate and drain of the transistor $MP_{sleep}$ is always connected through the transistor $MP_{passgate}$ and the virtual supply node "wlvcc" remains in the steady state voltage determined by the leakage on the word-line drivers and the sub threshold leakage of the gate-drain connected sleep transistor $MP_{sleep}$, in accordance with some embodiments. During a normal read/write operation, the underdrive value on "wl" is determined by the charge sharing of capacitance on node "wlvcc" and the capacitance at the word line net "wl". This scheme is expected to reduce the average current (e.g., up to 10 times) compared to the traditional contention schemes (e.g., FIG. 2).

While the embodiment of FIG. 4 illustrates a word-line driving apparatus to drive n-type access transistors of a bit-cell, a person skilled in the art would appreciate that the architecture of FIG. 4 can be modified to drive p-type access transistors of a bit-cell. For example, when an SRAM bit-cell, has p-type access transistors instead of n-type access transistors (e.g., a flipped version of SRAM bit-cell 102a), the p-type transistors of apparatus 400 are replaced with n-type transistors, "Vcc" is replaced with ground, and ground node is replaced with "Vcc". In this case, the diode-connected device in apparatus 400 becomes an n-type diode connected device, and the NAND gate may be replaced with a NOR gate.

Figure 6:
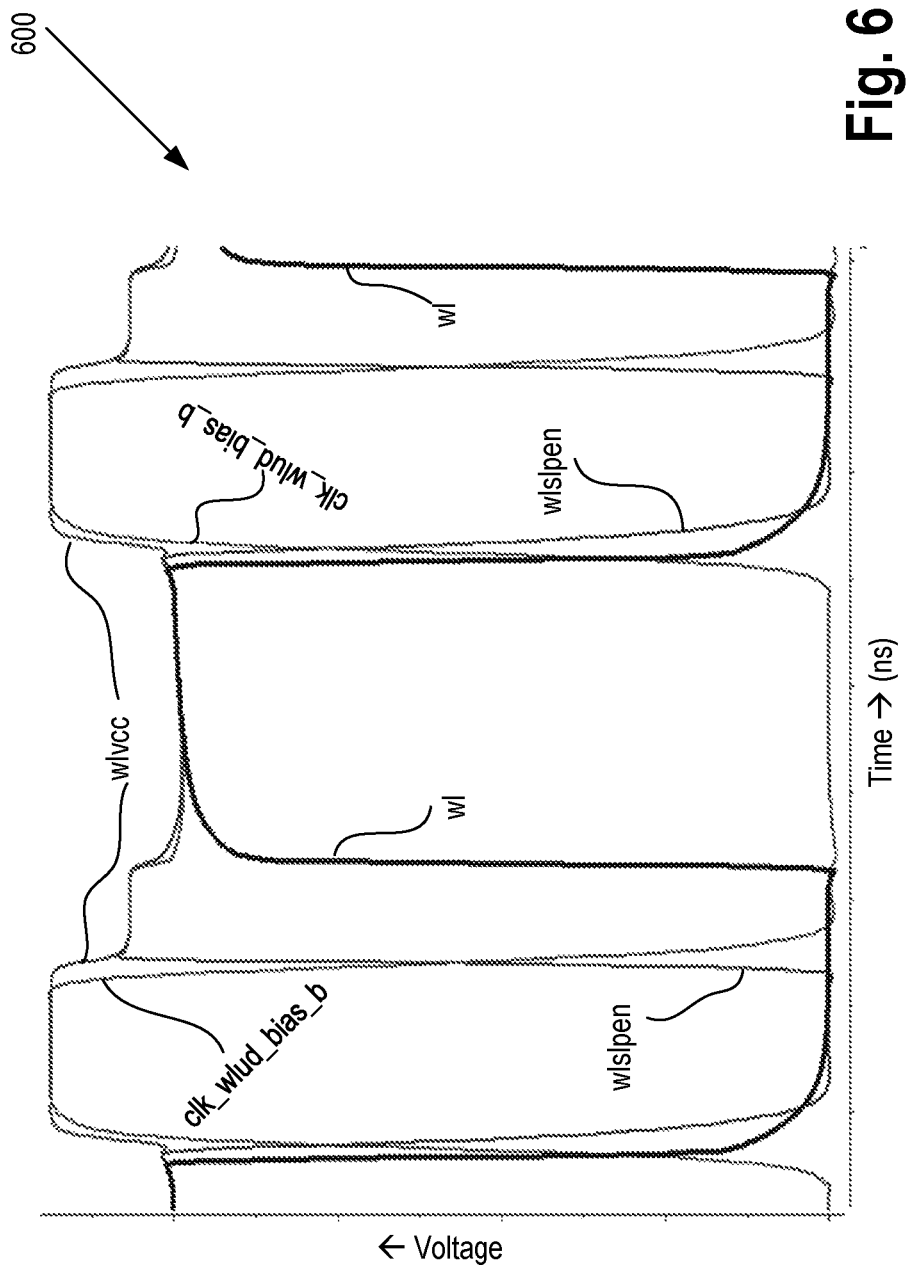
FIG. 6 illustrates a plot showing operation of the word-line driver with improved read stability, according to some embodiments of the disclosure.

FIG. 6 illustrates plot 600 showing operation of the word-line driver with improved read stability, according to some embodiments of the disclosure. Here, x-axis is time and y-axis is voltage. The voltages on various nodes of interest are shown. After $MP_{wldrv}$ transistor turns on, the capacitance on node "wlvcc" couples with the capacitance on word-line node "wl". The charge sharing between "wlvcc" and "wl" provides an extra underdrive on "wl". After the end of read or write operation, the node "wl_b" goes high and the word-line node "wl" discharges. The capacitance on "wlslpen" discharges to ground when "clk_wlud_bias" is logically low.

Figures 7A, 7B:
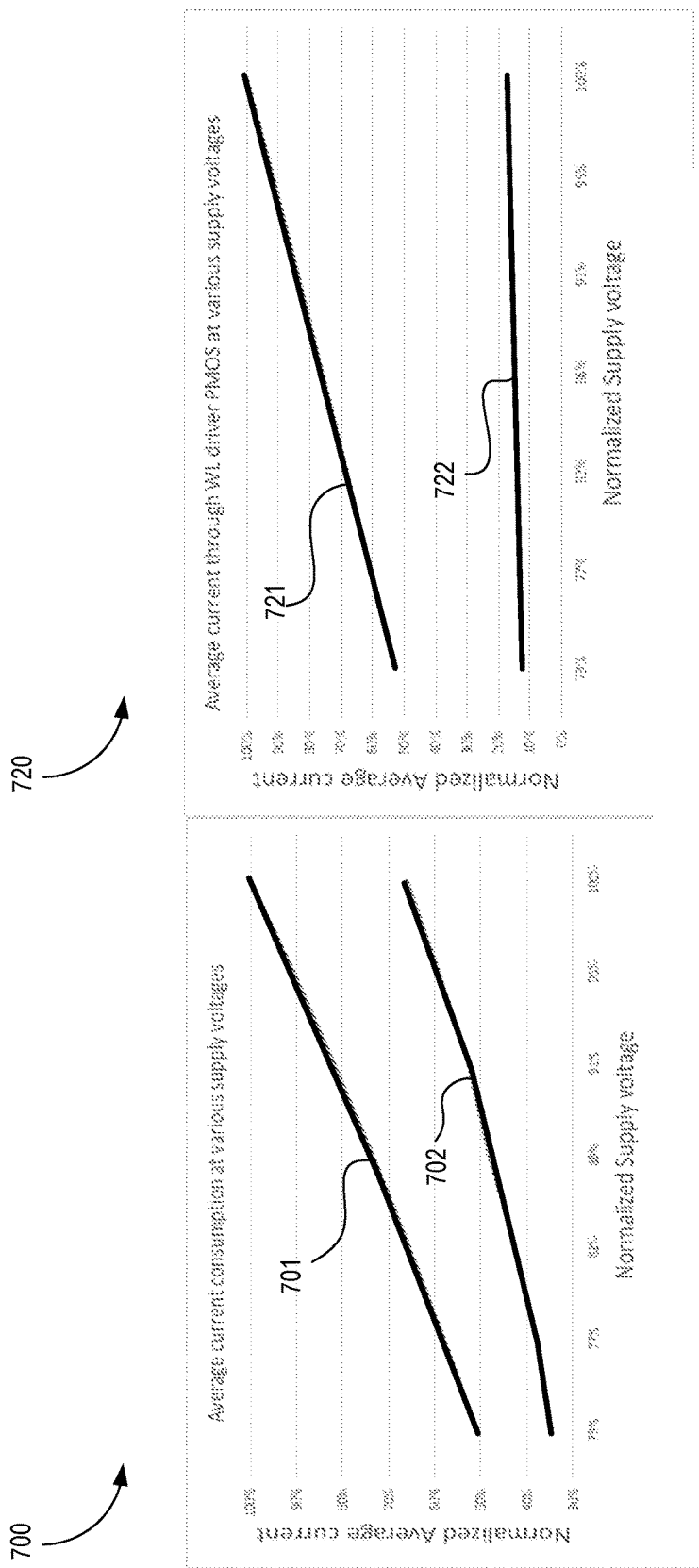
FIGS. 7A-B illustrate plots showing lower power consumption of the word-line driver compared to a traditional word-line driver, according to some embodiments of the disclosure.

FIGS. 7A-B illustrate plots 700 and 720, respectively, showing lower power consumption of the word-line driver compared to a traditional word-line driver, according to some embodiments of the disclosure. Here, x-axis is normalized supply voltage "Vcc" in percentage and y-axis is normalized average current in percentage. Plot 700 shows two waveforms—701 and 702. Waveform 701 is the average current consumption of apparatus 200 at various supply voltages while waveform 702 is the average current consumption of apparatus 400. Clearly, apparatus 400 in this example consumes less power than traditional word-line drivers. Plot 720 shows two waveforms—721 and 722. Waveform 721 is the average current consumption through the transistor $MP_{wldrv}$ of apparatus 200 at various supply voltages while waveform 722 is the average current consumption through the transistor $MP_{wldrv}$ of apparatus 400. Clearly, apparatus 400 in this example consumes less power than traditional word-line drivers and mitigates electro-migration problems in the word-line drivers.

Figure 8:
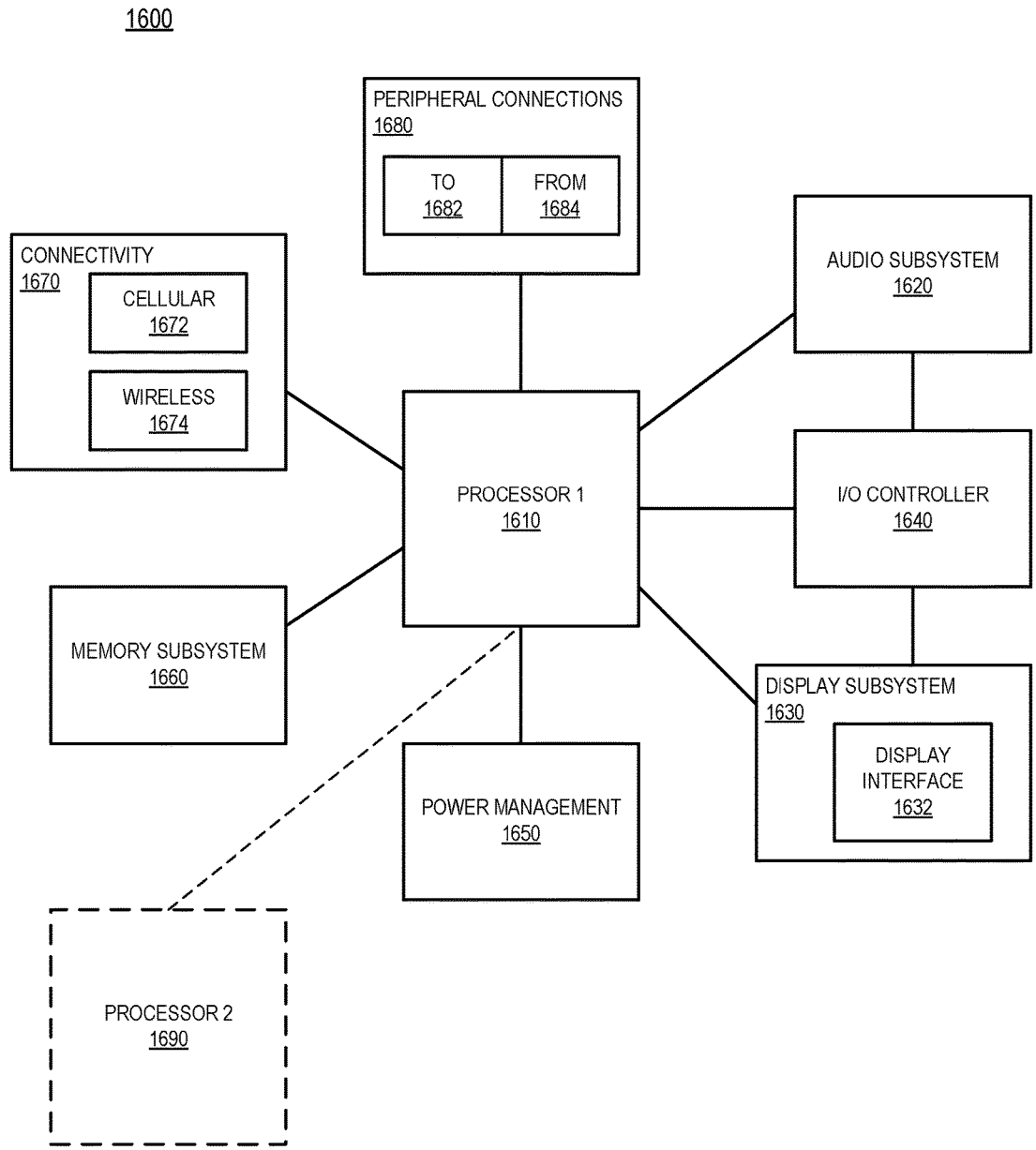
FIG. 8 illustrates a smart device or a computer system or a System-on-Chip (SoC) with a word-line driver having improved read stability, according to some embodiments.

FIG. 8 illustrates a smart device or a computer system or a System-on-Chip (SoC) with word-line driver having improved read stability, according to some embodiments. It is pointed out that those elements of FIG. 8 having the same reference numbers (or names) as the elements of any other figure can operate or function in any manner similar to that described, but are not limited to such.

FIG. 8 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes a first processor 1610 with word-line driver having improved read stability, according to some embodiments discussed.

Other blocks of the computing device 1600 may also include word-line driver having improved read stability, according to some embodiments. The various embodiments of the present disclosure may also comprise a network interface within 1670 such as a wireless interface so that a system embodiment may be incorporated into a wireless device, for example, cell phone or personal digital assistant.

In one embodiment, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. In some embodiments, audio subsystem 1620 includes apparatus and/or machine executable instructions to avoid self-hearing, according to some embodiments. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is an apparatus which comprises: a first transistor coupled to a first supply node; a word-line driver coupled in series with the first transistor, wherein the word-line driver has a second supply node coupled to the first transistor, and wherein the word-line driver is to provide a word-line signal for a memory; and a second transistor coupled to the second supply node and to a gate terminal of the first transistor, wherein the second transistor is controllable by a gated low power mode signal.

Example 2 includes all features of example 1 and wherein the word-line driver comprises: a third transistor coupled to the first and second transistors; and a fourth transistor coupled in series with the third transistor, wherein gate terminals of the third and fourth transistor are controllable by an input word-line signal.

Example 3 includes all features of example 2, and wherein the apparatus of example 2 comprises: a tristate-able driver having an output coupled to the first and second transistors.

Example 4 includes all features of example 3, and wherein the tristate-able driver comprises a fifth transistor coupled to the first supply node and to the first and second transistors, wherein the fifth transistor is controllable by a low power mode signal.

Example 5 includes all features of example 4, and wherein the tristate-able driver comprises a sixth transistor coupled in series with the fifth transistor, and controllable by the low power mode signal.

Example 6 includes all features of example 5, and wherein the tristate-able driver comprises a seventh transistor coupled in series with the sixth transistor, and wherein the seventh transistor is to be driven by a logic gate which is to provide the gated low power mode signal.

Example 7 includes all features of example 6, and wherein second transistor is to be driven by the logic gate.

Example 8 includes all features of example 6, and wherein the logic gate comprises one of: NAND gate, NOR, AND, or OR gate.

Example 9 is according to any one of examples 1 to 7, and wherein the supply node is a power supply node.

Example 10 is an apparatus which comprises: a pass-gate; a sleep transistor configured as a diode-connected device controllable by the pass-gate; and a word-line driver coupled to the sleep transistor and the pass-gate.

Example 11 includes all features of example 10, and wherein the apparatus of example 11 comprises tristate-able driver coupled to the sleep transistor.

Example 12 includes all features example 10, and wherein the tristate-able driver includes a footer transistor, and wherein a gate terminal of the footer transistor is coupled to the pass-gate.

Example 13 includes all features of example 12, and wherein the apparatus of example 13 comprises a logic gate having an output coupled to the gate terminal of the footer transistor.

Example 14 is a system which comprises: a processor; a memory comprising a static random access memory (SRAM); a word-line driver coupled to the memory, wherein the word-line driver comprises: a first transistor coupled to a first supply node; a driver coupled in series with the first transistor, wherein the driver has a second supply node coupled to the first transistor, and wherein the driver is to provide a word-line signal for the memory; and a second transistor coupled to the second supply node and to a gate terminal of the first transistor, wherein the second transistor is controllable by a gated low power mode signal; and a wireless interface for allowing the processor to communicate with another device.

Example 15 includes all features of example 14, and wherein the driver of the word-line driver comprises: a third transistor coupled to the first and second transistors; and a fourth transistor coupled in series with the third transistor, wherein gate terminals of the third and fourth transistor are controllable by an input word-line signal.

Example 16 includes all features of example 15, and wherein the word-line driver comprises a tristate-able driver having an output coupled to the first and second transistors.

Example 17 includes all features of example 16, and wherein the tristate-able driver comprises a fifth transistor coupled to the first supply node and to the first and second transistors, and wherein the fifth transistor is controllable by a low power mode signal.

Example 18 includes all features of example 17, and wherein the tristate-able driver comprises a sixth transistor coupled in series with the fifth transistor, and controllable by the low power mode signal.

Example 19 includes all features of example 18, and wherein the tristate-able driver comprises a seventh transistor coupled in series with the sixth transistor, and wherein the seventh transistor is to be driven by a logic gate.

Example 20 includes all features of example 19, and wherein the second transistor is driven by the logic gate.

Example 21 is a method which comprises: forming a first transistor; coupling the first transistor to a first supply node; forming a word-line driver; coupling the word-line driver in series with the first transistor; coupling a second supply node of the word-line driver to the first transistor, and wherein the word-line driver is to provide a word-line signal for a memory; forming the second transistor; and coupling the second transistor to the second supply node and to a gate terminal of the first transistor, wherein the second transistor is controllable by a gated low power mode signal.

Example 22 includes all features of example 21, wherein the method of example 22 comprises: forming a third transistor; coupling the third transistor to the first and second transistors; forming a fourth transistor; and coupling the fourth transistor in series with the third transistor, wherein gate terminals of the third and fourth transistor are controllable by an input word-line signal, and wherein the word-line driver comprises the third and fourth transistors.

Example 23 includes all features of example 22, wherein the method of example 23 comprises: forming a tristate-able driver; and coupling an output of the tristate-able driver to the first and second transistors.

Example 24 includes all features of example 23, wherein the method of example 23 comprises: forming a fifth transistor; and coupling the fifth transistor to the first supply node and to the first and second transistors, wherein the fifth transistor is controllable by a low power mode signal, and wherein the tristate-able driver comprises the fifth transistor.

Example 25 includes all features of example 24, and wherein the method of example 25 comprises: forming a sixth transistor; and coupling the sixth transistor in series with the fifth transistor, wherein the tristate-able driver is controllable by the low power mode signal, and wherein the tristate-able driver comprises the sixth transistor.

Example 26 includes all features of example 25, and wherein the method comprises: forming a seventh transistor; coupling the seventh transistor in series with the sixth transistor; and driving the seventh transistor by a logic gate which is to provide the gated low power mode signal, wherein the tristate-able driver comprises the seventh transistor.

Example 27 includes all features of example 26, and wherein the logic gate comprises one of: NAND gate, NOR, AND, or OR gate.

Example 28 is according to any one of examples 21 to 27, and wherein the supply node is a power supply node.

Example 29 is an apparatus which comprises: means for forming a first transistor; means for coupling the first transistor to a first supply node; means for forming a word-line driver; means for coupling the word-line driver in series with the first transistor; means for coupling a second supply node of the word-line driver to the first transistor, and wherein the word-line driver is to provide a word-line signal for a memory; means for forming the second transistor; and means for coupling the second transistor to the second supply node and to a gate terminal of the first transistor, wherein the second transistor is controllable by a gated low power mode signal.

Example 30 includes all features of example 29, wherein the apparatus of example 30 comprises: means for forming a third transistor; means for coupling the third transistor to the first and second transistors; means for forming a fourth transistor; and means for coupling the fourth transistor in series with the third transistor, wherein gate terminals of the third and fourth transistor are controllable by an input word-line signal, and wherein the word-line driver comprises the third and fourth transistors.

Example 31 includes all features of example 30, wherein the apparatus of example 30 comprises: means for forming a tristate-able driver; and means for coupling an output of the tristate-able driver to the first and second transistors.

Example 32 includes all features of example 31, wherein the apparatus of example 32 comprises: means for forming a fifth transistor; and means for coupling the fifth transistor to the first supply node and to the first and second transistors, wherein the fifth transistor is controllable by a low power mode signal, and wherein the tristate-able driver comprises the fifth transistor.

Example 33 includes all features of example 32, wherein the apparatus of example 33 comprises: means for forming a sixth transistor; and means for coupling the sixth transistor in series with the fifth transistor, wherein the tristate-able driver is controllable by the low power mode signal, and wherein the tristate-able driver comprises the sixth transistor.

Example 34 includes all features of example 33, wherein the apparatus of example 34 comprises: means for forming a seventh transistor; means for coupling the seventh transistor in series with the sixth transistor; and means for driving the seventh transistor by a logic gate which is to provide the gated low power mode signal, wherein the tristate-able driver comprises the seventh transistor.

Example 35 includes all features of 34, wherein the logic gate comprises one of: NAND gate, NOR, AND, or OR gate.

Example 36 is according to any one of examples 29 to 35, wherein the supply node is a power supply node.

Example 37 is a method which comprises: forming a pass-gate; forming a sleep transistor; configuring the sleep transistor as a diode-connected device controllable by the pass-gate; forming a word-line driver; and coupling the word-line driver to the sleep transistor and the pass-gate.

Example 38 includes all features of example 37, wherein the method of example 38 comprises: forming tristate-able driver; and coupling the tristate-able driver to the sleep transistor.

Example 39 includes all features of example 38, wherein the method of example 38 comprises: forming a footer transistor; and coupling a gate terminal of the footer transistor to the pass-gate, wherein the tristate-able driver includes the footer transistor.

Example 40 includes all features of example 39, wherein the method of example 40 comprises: forming a logic gate; and coupling an output of the logic gate to the gate terminal of the footer transistor.

Example 41 is an apparatus which comprises: means for forming a pass-gate; means for forming a sleep transistor; means for configuring the sleep transistor as a diode-connected device controllable by the pass-gate; means for forming a word-line driver; and means for coupling the word-line driver to the sleep transistor and the pass-gate.

Example 42 includes all features of example 41, wherein the apparatus of example 42 comprises: means for forming tristate-able driver; and means for coupling the tristate-able driver to the sleep transistor.

Example 43 includes all features of example 42, wherein the apparatus of example 43 comprises: means for forming a footer transistor; and means for coupling a gate terminal of the footer transistor to the pass-gate, wherein the tristate-able driver includes the footer transistor.

Example 44 includes all features of example 42, wherein the apparatus of example 44 comprises: means for forming a logic gate; and means for coupling an output of the logic gate to the gate terminal of the footer transistor.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a first transistor coupled to a first supply node;
   a word-line driver coupled in series with the first transistor, wherein the word-line driver has a second supply node coupled to the first transistor, and wherein the word-line driver is to provide a word-line signal for a memory; and
   a second transistor coupled to the second supply node and to a gate terminal of the first transistor, wherein the second transistor is controllable by a gated low power mode signal, wherein the second transistor has a source/drain terminal coupled to a gate of the first transistor, and wherein the second transistor has a drain/source terminal coupled to the second power supply node.

2. The apparatus of claim 1, wherein the word-line driver comprises:
   a third transistor coupled to the first and second transistors; and
   a fourth transistor coupled in series with the third transistor, wherein gate terminals of the third and fourth transistor are controllable by an input word-line signal.

3. The apparatus of claim 1 comprises a tristate-able driver having an output coupled to the first and second transistors.

4. The apparatus of claim 3, wherein the tristate-able driver comprises a fifth transistor coupled to the first supply node and to the first and second transistors, and wherein the fifth transistor is controllable by a low power mode signal.

5. The apparatus of claim 4, wherein the tristate-able driver comprises a sixth transistor coupled in series with the fifth transistor, and controllable by the low power mode signal.

6. The apparatus of claim 5, wherein the tristate-able driver comprises a seventh transistor coupled in series with the sixth transistor, and wherein the seventh transistor is to be driven by a logic gate which is to provide the gated low power mode signal.

7. The apparatus of claim 6, wherein second transistor is to be driven by the logic gate.

8. The apparatus of claim 6, wherein the logic gate comprises one of: NAND gate, NOR, AND, or OR gate.

9. The apparatus of claim 1, wherein the supply node is a power supply node.

10. An apparatus comprising:
    a pass-gate;
    a sleep transistor configured as a diode-connected device controllable by the pass-gate, wherein the pass-gate has a source/drain terminal coupled to a gate of the sleep transistor, and wherein the pass-gate has a drain/source terminal coupled to a power supply node; and
    a word-line driver coupled to the sleep transistor and the pass-gate via the power supply node.

11. The apparatus of claim 10 comprises tristate-able driver coupled to the sleep transistor.

12. The apparatus of claim 11, wherein the tristate-able driver includes a footer transistor, and wherein a gate terminal of the footer transistor is coupled to the pass-gate.

13. The apparatus of claim 12 comprises a logic gate having an output coupled to the gate terminal of the footer transistor.

14. A system comprising:
    a processor;
    a memory comprising a static random access memory (SRAM);
    a word-line driver coupled to the memory, wherein the word-line driver comprises:
      a first transistor coupled to a first supply node;
      a driver coupled in series with the first transistor, wherein the driver has a second supply node coupled to the first transistor, and wherein the driver is to provide a word-line signal for the memory; and
      a second transistor coupled to the second supply node and to a gate terminal of the first transistor, wherein the second transistor is controllable by a gated low power mode signal, wherein the second transistor has a source/drain terminal coupled to a gate of the first transistor, and wherein the second transistor has a drain/source terminal coupled to the second power supply node; and
    a wireless interface to allow the processor to communicate with another device.

15. The system of claim 14, wherein the driver of the word-line driver comprises:
    a third transistor coupled to the first and second transistors; and
    a fourth transistor coupled in series with the third transistor, wherein gate terminals of the third and fourth transistor are controllable by an input word-line signal.

16. The system of claim 14, wherein the word-line driver comprises a tristate-able driver having an output coupled to the first and second transistors.

17. The system of claim 16, wherein the tristate-able driver comprises a fifth transistor coupled to the first supply node and to the first and second transistors, and wherein the fifth transistor is controllable by a low power mode signal.

18. The system of claim 17, wherein the tristate-able driver comprises a sixth transistor coupled in series with the fifth transistor, and controllable by the low power mode signal.

19. The system of claim 18, wherein the tristate-able driver comprises a seventh transistor coupled in series with the sixth transistor, and wherein the seventh transistor is to be driven by a logic gate.

20. The system of claim 19, wherein the second transistor is driven by the logic gate.

* * * * *